Oct. 21, 1969 YOSHIYUKI MIZUTA 3,474,088

METAL-TO-SEMICONDUCTOR AREA CONTACT RECTIFYING ELEMENTS

Filed Jan. 24, 1967

INVENTOR.
YOSHIYUKI MIZUTA

BY

Hopgood & Calimafde
ATTORNEYS.

United States Patent Office 3,474,088

Patented Oct. 21, 1969

3,474,088

METAL-TO-SEMICONDUCTOR AREA CONTACT RECTIFYING ELEMENTS

Yoshiyuki Mizuta, Tokyo, Japan, assignor to Nippon Electric Company Limited, Tokyo, Japan, a corporation of Japan Filed Jan. 24, 1967, Ser. No. 611,375
Claims priority, application Japan, Jan. 26, 1966, 41/4,496
Int. Cl. H01l 5/00, 11/00
U.S. Cl. 317—234 3 Claims

ABSTRACT OF THE DISCLOSURE

A metal-to-semiconductor area contact rectifying element of planar-type structure, produced by forming an insulating film over the surface of a semiconductor crystal except for a small portion and electroplating lead (Pb) on said portion to a height exceeding conventional limitations. Electroplating may be assisted by irradiating the semiconductor at the barrier with light energy.

The present invention relates to rectifying elements generally and in particular to rectifying elements of the type incorporating metal-to-semiconductor area contacts.

Because of the lack of minority carrier injection into the semiconductor, metal-to-semiconductor contact rectifying elements have excellent rectification properties in the high frequency region and are also well adapted to high-speed switching.

It is known that especially in high frequency or high-speed circuits, the electrostatic capacities of such elements must be minimized in order to maintain the inter-electrode impedances as high as possible. The electrostatic capacity of the rectifying element is generally composed of the metal-to-semiconductor contact barrier capacity and interelectrode stray capacities, particularly the stray capacities between the semiconductor surface (other than the metal-to-semiconductor area contact portion) and the contact metal or its attached electrode. The barrier capacity is dependent upon the type of semiconductor, its resistivity, and the type of contact metal, whereas the stray capacity is determined solely by the geometrical structure of the metal-to-semiconductor contact rectifying element.

Conventional methods and structures have not been found to be satisfactory, either from the capacity standpoint, the adaptability to mass manufacturing, or structural rigidity. In one known procedure, an insulating film is first formed on the surface of a semiconductor wafer and a predetermined portion of the insulating film is then removed so that a part of the surface is exposed. For simplicity this type of structure shall be hereinafter termed a planar structure.

A suitable metal is then deposited on the exposed surface by vacuum evaporation or electrolytic plating. Quite disadvantageously, when the vacuum evaporation process is employed, the metal is inevitably deposited not only on the exposed surface but also on the insulating film surface, with the result that the stray capacity between the semiconductor surface and the deposited contact metal is increased. Removal of the unnecessarily deposited metal has been found to be difficult especially where the metal-to-semiconductor contact area is small or the deposited metal film is thick. If in an attempt to overcome these difficulties, the evaporated metal film is made comparatively thin, then the derived electrode closely approaches the semiconductor surface resulting in an increase in the stray capacity. Further, it then becomes more difficult to securely attach the electrode to the evaporated metal film.

Where the film is deposited by electroplating techniques, the plating area is restricted to the exposed surface and hence, there is only a minimum increase in the stray capacity. However, this advantage in electroplating is offset due to the fact that the semiconductor surface is often chemically affected or the attainment of the films to the desired thickness sometimes becomes impossible.

It must further be noted that the adhesion between the metal and the semiconductor in the area contact rectifying element is intrinsically lacking in mechanical rigidity, whether the film is electroplated or vacuum evaporated. The mechanical stress remaining in the metal film, which has relatively weak adhesion with the semiconductor, tends to cause exfoliation of the film. Even if the film does not exfoliate, poor contact portions may be produced in the contact area, with the result that the rectification properties of the element are hindered. This phenomenon, which becomes more pronounced the thicker the metal film, diametrically opposes the above-mentioned requirement that the film be sufficiently thick to draw out the electrode and reduce the capacity.

Accordingly, it is the object of this invention to provide planar type metal-to-semiconductor area contact rectifying elements with reduced electrode capacity provided by drawing out the electrode.

It is a further object of this invention to satisfy the foregoing object without substantially increasing the stray capacity and with a mechanically stable device which can be easily manufactured.

It is a feature of this invention to adopt lead as the metal to be brought in contact with the semiconductor and to employ electroplating techniques for the formation of the metal-to-semiconductor area contacts.

The combination of the planar structure and the lead plating method of the invention has been found to produce the following advantages:

(1) The dimensions of the desired metal-to-semiconductor contact area can be tailored to accuracies of the same order as other planar structures.

(2) There is no adherence of the plating metal on the insulating film and hence, no substantial increase in the stray capacity. Conservatively, this is the equivalent advantage obtainable from other planar structures using plating techniques.

(3) Lead is a malleable metal having a melting point within the allowable temperature range for the manufacture and operation of a rectifying element. This brings about the following advantages. First, the mechanical stress remaining in the plated metal is substantially overcome by the high malleability of lead and hence does not deleteriously affect the metal-to-semiconductor area contact or cause exfoliation of the contact metal or degradation of the electrical characteristics. This fact demonstrates the capabilities in planar structures for electroplating a much thicker metal than the insulating film and for forming considerably tall lead projections over the contact areas. Consequently a considerably bulky electrode relative to the contact area can be installed without substantially increasing the stray capacity.

Second, the rectification characteristics of an area contact barrier are, in general, highly susceptible to the influence of the pressure applied to the barrier surface. That is, the rectification characteristics are liable to be affected by an uneven force which inevitably results when a spring-type electrode is installed on the contact metal. However, the essentially high malleability of lead can absorb a surplus pressure through deformation of the lead projection. The contact areas of the area contact rectifying element according to the invention, being of the particular planar type, remain unchanged irrespective of the magnitude of the contact pressure. Even if a pinpoint-pressure is exerted upon a particular location on the projection head, that portion alone is deformed with the pressure on the area contact retained substantially uniform. Therefore the rectifying characteristics are negligibly affected by either the installation of the spring-type or another type electrode or by various thermal stresses caused during and after the fabrication of the rectifying element.

(4) Lead does not form a solid solution with silicon which is now looked upon as the most important semiconductor material. That is, lead does not alloy with silicon in the form of compounds or in the eutectic state. Thus the properties of the silicon surface are not materially affected by the contact metal (lead). Moreover, high temperature storage tests (up to 250° C. for long periods) have verified that the characteristics of rectifying elements do not deteriorate.

(5) The ionization tendency of lead is comparatively low—that is, the oxidation property of the lead ion is weak. Therefore, there is little or no possibility that the semiconductor surface will be oxidized as the lead ion is reduced to lead on the semiconductor surface. The reduction of the lead ion can take place only when the plating current is being conducted.

The advantage due to this phenomenon is twofold. First, the plating metal can be grown tenaciously on the contact area without chemically affecting the semiconductor surface; and second, the thickness or the metallurgical structure of the grown plating metal may be controlled by adjusting the plating current density.

The above mentioned and other features and objects of this invention and the manner of attaining them will become more apparent and the invention itself will best be understood by reference to the following description of embodiments of the invention taken in conjunction with the accompanying drawings wherein.

Figure 1:
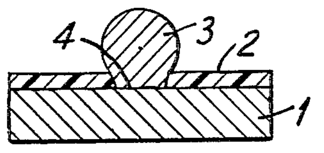
FIG. 1 is a cross sectional view of a metal-to-semiconductor area contact rectifying element according to the invention.

FIG. 1 is a diagrammatic representation in partial cross section of a metal-to-semiconductor area contact diode element according to a preferred embodiment of this invention. The height and the width of the diode element are of the order of 0.25 mm. and 0.5 mm., respectively. To illustrate the barrier and the projection portions conspicuously, the overall geometry is not in actual proportions. The diode element shown in FIG. 1 consists of a semiconductor substrate 1, an insulating film 2 formed thereon preferably capable of transmitting a beam of light having wavelengths adapted for the occurrences of carries in the semiconductor substrate, and a semi-spherical projection of electroplated lead 3. Between the semiconductor substrate 1 and the lead 3, there is a rectifying area contact 4. The diode element may be manufactured by the process to be described.

Before entering upon this description, however, it bears mentioning that the primary purpose of electroplating lead on the semiconductor surface is to establish metal-to-semiconductor area contacts provided with rectification properties. It is sometimes the case with such contact barriers formed by plating that they lack sufficient conduction properties within the voltage range for plating or that the plating current is directed opposite to the forward direction of the barrier (an example is p-type silicon having a rectifying property with respect to lead).

In order to conduct a suitable plating current from the semiconductor side, the electrical conductivity of the metal-to-semiconductor contact may be increased by irradiating the semiconductor surface at the barrier and its peripheral portion with an intense beam of light. If lead were plated all over the semiconductor surface so as to inhibit the entrance of the incident light, the plating current would be gradually decreased with elapsed time and the cessation of the plating process would eventually result. According to the invention, however, a sufficient plating current for the growth of a lead film to a sufficient thickness is possible with the planar structure wherein the plating portion occupies only a small part of the entire semiconductor surface and an insulating film is used that can transmit irradiated light.

A silicon oxide film 2 is formed on a p-type silicon crystal 1, with an epitaxial layer having resistivities of the order of .1 Ω-cm. by thermal oxidation. A part of the film is etched off in circular form (e.g. 50 microns in diameter) by the photoengraving technique so that it is exposed. The etched portion is then subjected to an electrolytic plating process, using a lead plating solution containing lead fluoborate as the main constituent, for growing the lead projection 3.

Prior to subjecting the wafer to the lead plating process, the rear surface of the crystal 1 is plated with a nickel film and the nickel-film-coated wafer is then subjected to a sintering process for a brief time.

Figure 4:
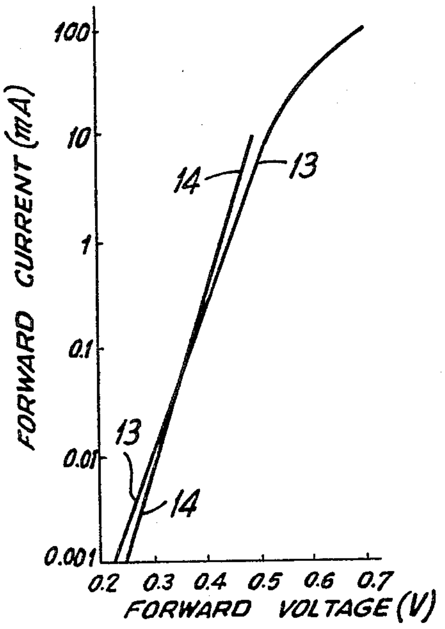
FIGS. 4 and 5 show forward and reverse current-voltage characteristics respectively of the diode illustrated in FIG. 3.
Figure 5:
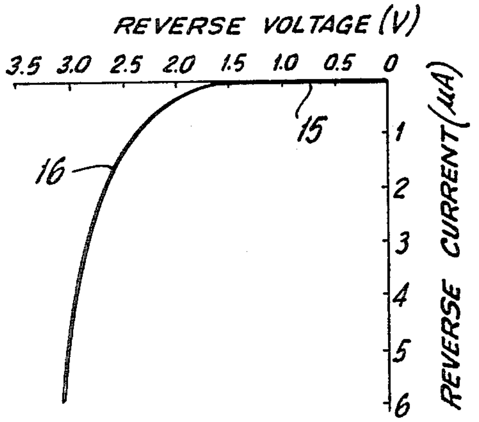

The voltage-current characteristics of the diode element thus made are as illustrated in FIGS. 4 and 5. FIG. 4 is a semilog plot of the forward characteristics at room temperature, current and voltage being respectively taken as the ordinate and the abscissa. In FIG. 4, curve 13 denotes the forward characteristic of the diode element and the curve 14 denotes the theoretical characteristic of a metal semiconductor area contact diode (which is a straight line on a semilog graph).

Theory predicts that the gradient of the linear curve of the diode will remain unchanged at room temperature. This characteristic the present inventor has found may be conveniently utilized as a criterion for an assessment of the characteristic curve of the manufactured diode element by comparing the gradients of the linear portion of a semilog plot of the characteristic curve 13 with the gradient of the theoretical curve 14. The gradient ratios should ideally be unity, but are at least of the order of 1.2 with the most favorable metal-silicon area contact diodes (with silicon substrates having specific resistivity of the order of 0.1 Ω-cm.) thus far obtained. The diode element of the invention indicates a ratio of approximately 1.2. This value may be said to be excellent.

FIG. 5 illustrates the reverse characteristics of the same diode. It is to be noted that the reverse current values for the flat curve portion 15 are extremely small. This indicates that the leakage currents are extremely small—that is, the diode element is provided with near perfect reverse characteristics. The remaining portion 16 of the curve denotes a current increase due to application of a voltage in excess of the reverse breakdown voltage. From the viewpoint of the breakdown voltage, this characteristic curve is found to be representative of p-type silicon crystals with resistivities of the order of 0.1 Ω-cm.

Figure 2:
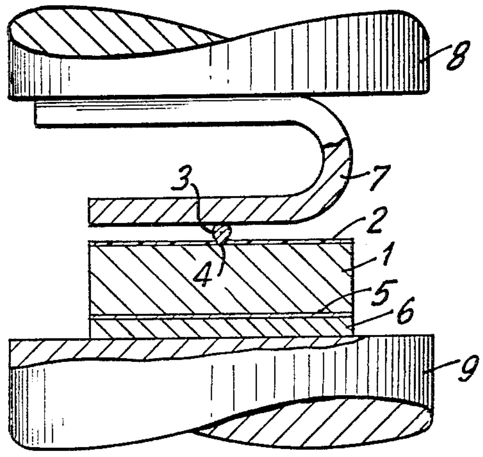
FIG. 2 is a partly cross sectional view of the inventive rectifying element combined with external electrodes.

FIG. 2 illustrates an arrangement for deriving electrodes from the diode element shown in FIG. 1. The same reference numerals as used in FIG. 1 are adopted for equivalent parts. The lead-out electrodes 8 and 9 will be respectively termed the upper and lower lead-out electrodes when referring to this illustration. A metallic layer 5 (preferably plated nickel) is provided over the lower surface of the semiconductor substrate 1 to form an ohmic contact with the substrate. Another metallic layer 6 is also provided to electrically and mechanically connect the semiconductor 1 to the lower lead-out electrode 9. When using lead as the material of this layer 6, it may be formed simultaneously with the growth of the lead projection 3.

In the fabrication of the diode, a U-shaped plate spring electrode 7 is installed to electrically bridge the lead projection 3 and the upper lead-out electrode 8. The spring electrode is disposed so that a portion of one arm is welded to the upper lead-out electrode 8 and the lower surface of the other arm is made substantially parallel to the semiconductor surface. Thus the spring electrode 7 is balanced or rests on the projection 3 utilizing its spring force. If the projection 3 is too low, either side of the lower arm may easily touch the semiconductor surface, thereby calling for rigorous parallelism between the two surfaces to maintain the illustrated position. This renders the manufacturing of the diode extremely difficult. This tendency may be relieved by adopting the electroplating techniques of the inveniton and using a considerably tall lead projection. This feature of this invention is eminently advantageous in the fabrication of the diode in quantity production.

Consider a metal-to-semiconductor contact diode having a circular contact area, 20 microns in diameter. If a hard plating metal such as silver or nickel is used according to convenitonal practice, the thickness of the contact metal layer formed by electroplating or vacuum evaporation without the apprehension of exfoliation must be less than 1 micron. In order to connect the electrode to the area contact with a spring electrode such as that shown, the insulating film will have to be made thinner than the contact metal layer. In other words, the clearance between the spring electrode and the semiconductor surface must be less than 1 micron when using a hard plating metal.

According to the invention, however, the height of the contact metal or the lead projection is of the order of tens of microns (e.g. 30) under equivalent circumstances and the stray capacity between the spring electrode and the semiconductor surface can be reduced to one-thirtieth (1/30) of that which would be obtained by the conventional design. With the construction of this embodiment, therefore, a spring electrode, approximately 500 microns in both length and width, can be used. Further deviations from parallelism of the order of 10 degrees may be tolerated, and the manufacture of the diode is extremely easy in batch fabrication.

Figure 3:
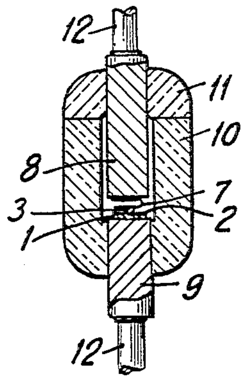
FIG. 3 is a partly cross sectional view of a typical diode structure incorporating the rectifying element of this invention.

FIG. 3 is a typical diode structure approximately 4 mm. in length and 2 mm. in width, incorporating the metal-to-semiconductor contact diode element shown in FIG. 1 and the electrodes shown in FIG. 2. Again the same reference numerals as used in FIGS. 1 and 2 are used to designate equivalent parts. The diode consists of a package 10 for insulating and holding the lead-out electrodes 8 and 9, a sealing resin or low-melting-point glass 11, and two lead wires 12 connected respectively to the lead-out electrodes 8 and 9. The package 10 may be fused with the electrode 9 into a single body beforehand and this single body and the electrode 8 may be hermetically sealed with an epoxy resin 11.

While the principles of this invention have been described with the preferred embodiment and the typical constructional example for the incorporation thereof into a diode, it is to be clearly understood that they are capable of variation and modification without substantially departing from the spirit of this invention and the scope of this invention is intended to be limited solely by the accompanying claims.

What is claimed is:

1. A metal-to-semiconductor area contact rectifying element comprising a semiconductor crystal having two major surfaces; a pebble-shaped piece of lead in firm contact with a small portion of one of said surfaces; and a pair of electrodes connected to the other of said surfaces and said piece of lead.

2. The rectifying element claimed in claim 1 wherein the height of said piece of lead is of the order of 30 microns.

3. The rectifying element claimed in claim 1 wherein an insulating film is formed over the first-mentioned one of said surfaces of said crystal save for said small portion.

References Cited

UNITED STATES PATENTS

| | | | |
|---|---|---|---|
| 2,530,110 | 11/1950 | Woodyard | 317—235 |
| 2,928,162 | 3/1960 | Marinacle | 317—234 |
| 3,212,160 | 10/1965 | Dale et al. | 317—234 |
| 3,257,588 | 6/1966 | Mueller | 317—234 |

JOHN W. HUCKERT, Primary Examiner

A. J. JAMES, Assistant Examiner

U.S. Cl. X.R.

317—235